(12) United States Patent
Lee et al.

(10) Patent No.: US 10,262,972 B2
(45) Date of Patent: Apr. 16, 2019

(54) SEMICONDUCTOR PACKAGES INCLUDING STACKED CHIPS

(71) Applicant: SK hynix Inc., Icheon-si, Gyeonggi-do (KR)

(72) Inventors: Seung Yeop Lee, Suwon-si (KR); Jin Kyoung Park, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/829,260

(22) Filed: Dec. 1, 2017

(65) Prior Publication Data
US 2018/0342481 A1  Nov. 29, 2018

(30) Foreign Application Priority Data
May 25, 2017 (KR) .................. 10-2017-0064821

(51) Int. Cl.
*H01L 25/065* (2006.01)
*H01L 25/18* (2006.01)
*H01L 23/00* (2006.01)

(52) U.S. Cl.
CPC .......... *H01L 25/0652* (2013.01); *H01L 25/18* (2013.01); *H01L 24/32* (2013.01); *H01L 24/33* (2013.01); *H01L 24/48* (2013.01); *H01L 24/73* (2013.01); *H01L 2224/32145* (2013.01); *H01L 2224/32225* (2013.01); *H01L 2224/33181* (2013.01); *H01L 2224/48091* (2013.01); *H01L 2224/48106* (2013.01); *H01L 2224/48145* (2013.01); *H01L 2224/48227* (2013.01); *H01L 2224/73215* (2013.01); *H01L 2224/73265* (2013.01); *H01L 2225/0651* (2013.01); *H01L 2225/06506* (2013.01); *H01L 2225/06562* (2013.01); *H01L 2225/06565* (2013.01); *H01L 2225/06586* (2013.01); *H01L 2924/1434* (2013.01)

(58) Field of Classification Search
CPC ..... H01L 25/0652; H01L 25/18; H01L 24/33; H01L 24/73; H01L 24/48; H01L 24/32; H01L 2224/33181; H01L 2224/73265; H01L 2224/73215; H01L 2224/48145; H01L 2224/48091; H01L 2224/32145; H01L 2224/48106; H01L 2224/48227; H01L 2224/32225; H01L 2225/0651; H01L 2225/06506; H01L 2225/06565; H01L 2225/06586; H01L 2225/06562; H01L 2924/1434
See application file for complete search history.

(56) References Cited

U.S. PATENT DOCUMENTS 6,049,129 A * 4/2000 Yew ................. H01L 23/24
                                                    257/737
6,376,904 B1 * 4/2002 Haba ................ H01L 23/3128
                                                    257/686
6,621,155 B1 * 9/2003 Perino ............... H01L 23/3128
                                                    257/686

(Continued)

*Primary Examiner* — Earl N Taylor
(74) *Attorney, Agent, or Firm* — William Park & Associates Ltd.

(57) ABSTRACT

A semiconductor package may include a first chip stack including first chips which are stacked on a package substrate. The semiconductor package may include a second chip stack including second chips which are stacked on the package substrate. The semiconductor package may include a third chip disposed on the first and second chip stacks.

12 Claims, 11 Drawing Sheets

(56) References Cited

U.S. PATENT DOCUMENTS

| | | | |
|---|---|---|---|
| RE43,720 E * | 10/2012 | Perino | H01L 23/3128 257/686 |
| 8,415,808 B2 * | 4/2013 | Liao | H01L 25/0657 257/777 |
| 8,981,574 B2 * | 3/2015 | Kim | H01L 24/73 257/777 |
| 9,082,632 B2 * | 7/2015 | Dayringer | H01L 25/0652 |
| 9,437,586 B2 * | 9/2016 | Hong | H01L 25/0657 |
| 9,633,973 B2 * | 4/2017 | Kim | H01L 24/73 |
| 2004/0016999 A1 * | 1/2004 | Misumi | H01L 24/49 257/678 |
| 2007/0241441 A1 * | 10/2007 | Choi | H01L 25/0652 257/686 |
| 2009/0230528 A1 * | 9/2009 | McElrea | H01L 24/24 257/676 |
| 2009/0243064 A1 * | 10/2009 | Camacho | H01L 23/3121 257/680 |
| 2010/0295166 A1 * | 11/2010 | Kim | H01L 21/56 257/692 |
| 2010/0327461 A1 * | 12/2010 | Co | H01L 24/24 257/777 |
| 2011/0156232 A1 * | 6/2011 | Youn | G11C 5/02 257/686 |
| 2011/0161583 A1 * | 6/2011 | Youn | G11C 7/02 711/115 |
| 2012/0281449 A1 * | 11/2012 | Kim | G11C 5/063 365/63 |
| 2012/0315726 A1 * | 12/2012 | Byun | H01L 25/0657 438/109 |
| 2013/0049224 A1 * | 2/2013 | Sutardja | H01L 23/13 257/774 |
| 2013/0078763 A1 * | 3/2013 | Lee | H01L 24/24 438/107 |
| 2014/0175673 A1 * | 6/2014 | Kim | H01L 24/73 257/777 |
| 2015/0108663 A1 * | 4/2015 | Hong | H01L 25/0657 257/777 |
| 2015/0155266 A1 * | 6/2015 | Kim | H01L 24/73 257/737 |
| 2015/0200187 A1 * | 7/2015 | Park | H01L 24/32 257/777 |
| 2016/0013159 A1 * | 1/2016 | Kwon | H01L 25/0657 257/627 |
| 2017/0179079 A1 * | 6/2017 | Kim | H01L 23/49816 |

* cited by examiner

SEMICONDUCTOR PACKAGES INCLUDING STACKED CHIPS

CROSS-REFERENCE TO RELATED APPLICATIONS

The present application claims priority under 35 U.S.C 119(a) to Korean Application No. 10-2017-0064821, filed on May 25, 2017, which is incorporated herein by reference in its entirety.

BACKGROUND

1. Technical Field

Embodiments of the present disclosure may generally relate to semiconductor package technologies and, more particularly, to semiconductor packages including a semiconductor chip stack structure.

2. Related Art

In the electronics industry, various techniques for stacking a plurality of semiconductor chips have been developed to increase the number of semiconductor chips embedded in a single semiconductor package. That is, various packaging techniques have been proposed to increase a memory capacity of the semiconductor package. For example, a plurality of semiconductor memory chips may be stacked to be laterally offset to realize a large capacity of semiconductor memory packages. In such a case, the stacked semiconductor memory chips may provide a step structure. The large capacity of semiconductor memory packages may be employed in electronic systems necessitating a large memory capacity. In the event that a plurality of semiconductor chips are stacked to realize a semiconductor package, a thickness of the semiconductor package may increase. Thus, a lot of effort has been focused on developing large capacity semiconductor memory packages without increasing a thickness of the large capacity semiconductor memory packages.

SUMMARY

According to an embodiment, a semiconductor package may be provided. The semiconductor package may include a first chip stack including first chips which may be offset from one another and stacked on a package substrate. The semiconductor package may include a second chip stack including second chips which may be offset from one another and stacked on a package substrate. The semiconductor package may include a third chip disposed on the first and second chip stacks and supported by the first and second chip stacks.

According to an embodiment, a semiconductor package may be provided. The semiconductor package may include a first chip stack including first chips which may be offset from one another and stacked on a package substrate. The semiconductor package may include a second chip stack including second chips which may be offset from one another and stacked on a package substrate. The semiconductor package may include a third chip supported by the first and second chip stacks, first bonding wires electrically connecting the first chips to the package substrate, and second bonding wires electrically connecting the second chips to the package substrate. The first bonding wires may extend to provide extension portions connecting the first chip stack to the third chip.

According to an embodiment, a semiconductor package may be provided. The semiconductor package may include a first chip stack including first chips which stacked on a package substrate. The semiconductor package may include a second chip stack including second chips stacked on the package substrate. The semiconductor package may include a third chip disposed on the first and second chip stacks. A distance between topmost chips of the first and second chip stacks may be less than a distance between bottommost chips of the first and second chip stacks.

According to an embodiment, a semiconductor package may be provided. The semiconductor package may include a first chip stack disposed on a package substrate. The semiconductor package may include a second chip stack disposed on the package substrate. The semiconductor package may include a third chip disposed on the first and second chip stacks. Chips of the first and second chip stacks may be configured and the first and second chips stacks may be positioned on the package substrate so that a width of a total area in which the first and second chip stacks are disposed is reduced rather than increased.

According to an embodiment, a semiconductor package may be provided. The semiconductor package may include a first chip stack disposed on a package substrate. The semiconductor package may include a second chip stack disposed on the package substrate. The semiconductor package may include a third chip disposed on the first and second chip stacks and configured to prevent the first and second chip stacks from collapsing.

According to an embodiment, a semiconductor package may be provided. The semiconductor package may include a first chip stack including first chips which may be offset from one another and stacked on a package substrate. The semiconductor package may include a second chip stack including second chips which may be offset from one another and stacked on a package substrate. The semiconductor package may include a third chip supported by the first and second chip stacks. The semiconductor package may include a chip connection structure configured to electrically connect the first chips to the package substrate, electrically connect the first chips to the third chip, and electrically couple the second chips to the third chip by electrically connecting the second chips to the package substrate.

DETAILED DESCRIPTION

Figure 1:
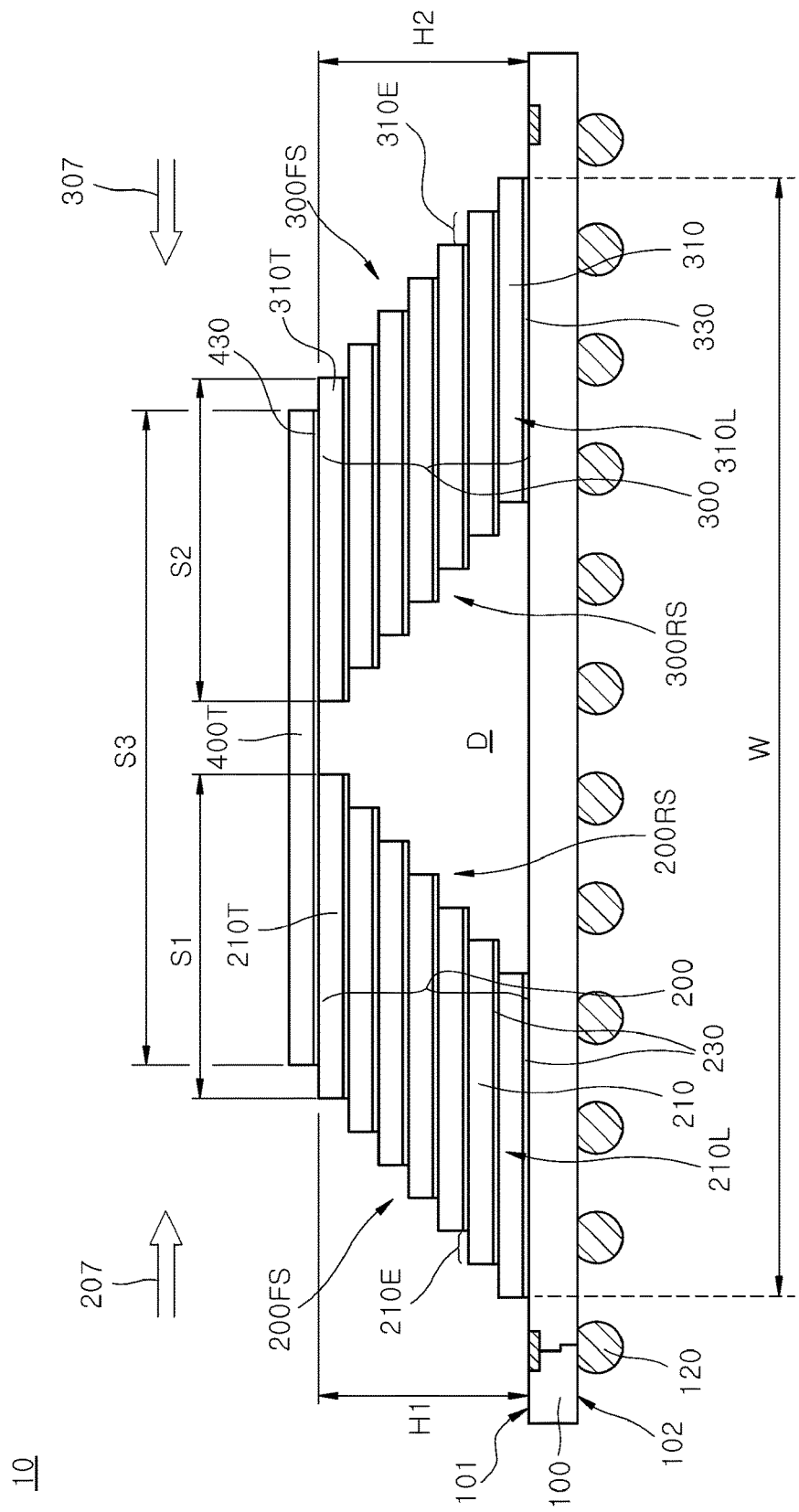
FIG. 1 is a cross-sectional view illustrating a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Thus, even though a reference numeral is not mentioned or described with reference to a drawing, the reference numeral may be mentioned or described with reference to another drawing. In addition, even though a reference numeral is not illustrated in a drawing, it may be mentioned or described with reference to another drawing.

FIG. 1 is a cross-sectional view illustrating conceptional structure of a semiconductor package 10 according to an embodiment. Referring to FIG. 1, the semiconductor package 10 may include a package substrate 100 as well as a first chip stack 200 and a second chip stack 300 which are attached to the package substrate 100. The semiconductor package 10 may further include a third chip 400T which is supported by the first and second chip stacks 200 and 300. The first and second chip stacks 200 and 300 may be disposed to support both ends of the third chip 400T like piers. That is, both ends of the third chip 400T may be respectively put on the first and second chip stacks 200 and 300 like a bridge. The first and second chip stacks 200 and 300 may be disposed to be spaced apart from each other in a plan view. Thus, the third chip 400T may be supported by both of the first and second chip stacks 200 and 300. Accordingly, a space D between the first and second chip stacks 200 and 300 may be provided under the third chip 400T.

A height H1 of the first chip stack 200 may be substantially equal to a height H2 of the second chip stack 300. The height H1 of the first chip stack 200 may correspond to a distance between a first surface 101 of the package substrate 100 and a top surface of a topmost chip 210T of the first chip stack 200 stacked on the first surface 101 of the package substrate 100. The height H2 of the second chip stack 300 may correspond to a distance between the first surface 101 of the package substrate 100 and a top surface of a topmost chip 310T of the second chip stack 300 stacked on the first surface 101 of the package substrate 100. Since the first and second chip stacks 200 and 300 have substantially the same height, the third chip 400T may be horizontally disposed and may be stably supported by the first and second chip stacks 200 and 300.

Since the third chip 400T may be attached to both of the first and second chip stacks 200 and 300, the third chip 400T may have a width S3 which is greater than a width S1 of the topmost chip 210T of the first chip stack 200 or a width S2 of the topmost chip 310T of the second chip stack 300. A third adhesive layer 430 may be introduced into an interface between the third chip 400T and the topmost chip 210T of the first chip stack 200 as well as an interface between the third chip 400T and the topmost chip 310T of the second chip stack 300 to attach the third chip 400T to the topmost chips 210T and 310T.

The third adhesive layer 430 may fix the first and second chip stacks 200 and 300 to the third chip 400T. Thus, the first and second chip stacks 200 and 300 may be fixed to each other by the third chip 400T to stably stand on the package substrate 100. The third chip 400T may act as a binding member for preventing the first and second chip stacks 200 and 300 from collapsing or falling down. Thus, the height H1 of the first chip stack 200 and the height H2 of the second chip stack 300 may increase due to the presence of the third chip 400T. That is, even though the number of first chips 210 (i.e., first semiconductor chips) stacked in the first chip stack 200 and the number of second chips 310 (i.e., second semiconductor chips) stacked in the second chip stack 300 increase, the third chip 400T attached to the first and second chip stacks 200 and 300 may effectively prevent the first and second chip stacks 200 and 300 from collapsing or falling down. Accordingly, it may be possible to increase the total number of the first and second chips 210 and 310 embedded in the semiconductor package 10 without collapse or stack failure of the first and second chip stacks 200 and 300.

The first chip stack 200 may be comprised of the first chips 210 which are vertically stacked on the package substrate 100, and the second chip stack 300 may be comprised of the second chips 310 which are vertically stacked on the package substrate 100. The first and second chip stacks 200 and 300 may be disposed on the package substrate 100 so that a sidewall of the first chip stack 200 faces a sidewall of the second chip stack 300. The first and second chip stacks 200 and 300 may be disposed to be symmetric with respect to a vertical straight line between the first chip stack 200 and the second chip stack 300. Since the first and second chip stacks 200 and 300 are disposed to be side-by-side on the package substrate 100, the number of the semiconductor chips 210 and 310 embedded in the semiconductor package 10 may increase even without increasing a total thickness of the semiconductor package 10.

The package substrate 100 may be configured to include an interconnect structure for electrically and signally connect the semiconductor chips 210 and 310 embedded in the semiconductor package 10 to an external device. The interconnect structure of the package substrate 100 may have any one of various configurations. For example, the package substrate 100 may be a printed circuit board (PCB), an interposer, a flexible printed circuit board (FPCB), or the like. The first and second chip stacks 200 and 300 may be disposed on the first surface 101 of the package substrate 100. Outer connectors 120, for example, solder balls or bumps may be disposed on a second surface 102 of the package substrate 100 opposite to the first and second chip stacks 200 and 300 to electrically connect the first and second chip stacks 200 and 300 to an external device.

Each of the first and second chip stacks 200 and 300 may include the first or second chips 210 or 310 which are stacked on the package substrate 100 to provide a step structure. A first adhesive layer 230 may be introduced into interfaces between the first chips 210 as well as between a bottommost chip 210L of the first chip stack 200 and the first surface 101 of the package substrate 100 to fix the first chip stack 200 to the package substrate 100. A second adhesive layer 330 may be introduced into interfaces between the second chips 310 as well as between a bottommost chip 310L of the second chip stack 300 and the first surface 101 of the package substrate 100 to fix the second chip stack 300 to the package substrate 100.

The first chips 210 including the bottommost chip 210L and the topmost chip 210T may be sequentially stacked to be offset to provide the first chip stack 200 having a step structure. Similarly, the second chips 310 including the bottommost chip 310L and the topmost chip 310T may be sequentially stacked to be offset to provide the second chip stack 300 having a step structure. The first and second chips 210 and 310 may be stacked so that the first and second chip stacks 200 and 300 are symmetric with respect to a vertical straight line between the first chip stack 200 and the second chip stack 300. For example, the first chips 210 may be sequentially stacked to be offset in a first offset direction 207 to build the first chip stack 200 having a step structure. One of the first chips 210 may be stacked on another chip of the first chips 210 to be offset so that a first edge portion 210E of the other chip of the first chips 210 is exposed. In addition, the second chips 310 may be sequentially stacked to be offset in a second offset direction 307 to build the second chip stack 300 having a step structure. One of the second chips 310 may be stacked on another chip of the second chips 310 to be offset so that a second edge portion 310E of the other chip of the second chips 310 is exposed. In such a case, the first offset direction 207 may be substantially an opposite direction to the second offset direction 307.

According to the first and second chip stacks 200 and 300 built by the above description, a distance between the topmost chips 210T and 310T may become closer as compared with a distance between the bottommost chips 210L and 310L. Since the topmost chips 210T and 310T are attached and fixed to the third chip 400T, the first and second chip stacks 200 and 300 may be bonded to the third chip 400T. Thus, even though the heights H1 and H2 of the first and second chip stacks 200 and 300 increase, the third chip 400T may effectively prevent the first and second chip stacks 200 and 300 from collapsing or falling down. Accordingly, it may be possible to increase the number of the first and second chips 210 and 310 constituting the first and second chip stacks 200 and 300. That is, it may be possible to increase the number of the first and second chips 210 and 310 embedded in the semiconductor package 10.

The first chip stack 200 may have a first forward stepwise sidewall 200FS that exposes the first edge portions 210E to provide a stair-shaped profile and a first reverse stepwise sidewall 200RS which is opposite to the first forward stepwise sidewall 200FS. The second chip stack 300 may have a second forward stepwise sidewall 300FS that exposes the second edge portions 310E to provide a stair-shaped profile and a second reverse stepwise sidewall 300RS which is opposite to the second forward stepwise sidewall 300FS. The first and second chip stacks 200 and 300 may be positioned so that the second reverse stepwise sidewall 300RS faces the first reverse stepwise sidewall 200RS. Thus, a width W of a total area in which the first and second chip stacks 200 and 300 are disposed may be reduced. If the first and second chip stacks 200 and 300 are positioned so that the first reverse stepwise sidewall 200RS faces the second forward stepwise sidewall 300FS or the second reverse stepwise sidewall 300RS faces the first forward stepwise sidewall 200FS, the width W of the total area in which the first and second chip stacks 200 and 300 may increase. In such a case, it may be necessary to increase a width of the package substrate 100.

The first chips 210 constituting the first chip stack 200 may have the same size (i.e., the same thickness and the width) and the same function. Alternatively, at least one of the first chips 210 constituting the first chip stack 200 may have a different size (i.e., a different thickness and/or a different width) and a different function from the other chips of the first chips 210. The second chips 310 constituting the second chip stack 300 may have the same size (i.e., the same thickness and the width) and the same function. Alternatively, at least one of the second chips 310 constituting the second chip stack 300 may have a different size (i.e., a different thickness and/or a different width) and a different function from the other chips of the second chips 310. In some embodiments, the first and second chips 210 and 310 may have the same size (i.e., the same thickness and the width) and the same function. In such a case, each of the first and second chips 210 and 310 may be a memory chip in which memory cells are integrated.

If the first and second chips 210 and 310 have substantially the same thickness and the number of the first chips 210 is equal to the number of the second chips 310, the height H1 of the first chip stack 200 may be substantially equal to the height H2 of the second chip stack 300. If a thickness of the first chips 210 is different from a thickness of the second chips 310 or the number of the first chips 210 is different from the number of the second chips 310, a height difference between the first and second chip stacks 200 and 300 may be compensated by controlling a thickness of the first adhesive layer 230 or by introducing a spacer (not illustrated) or an interposer (not illustrated) into an interface between the first chips 210 or the second chips 310.

Figure 2:
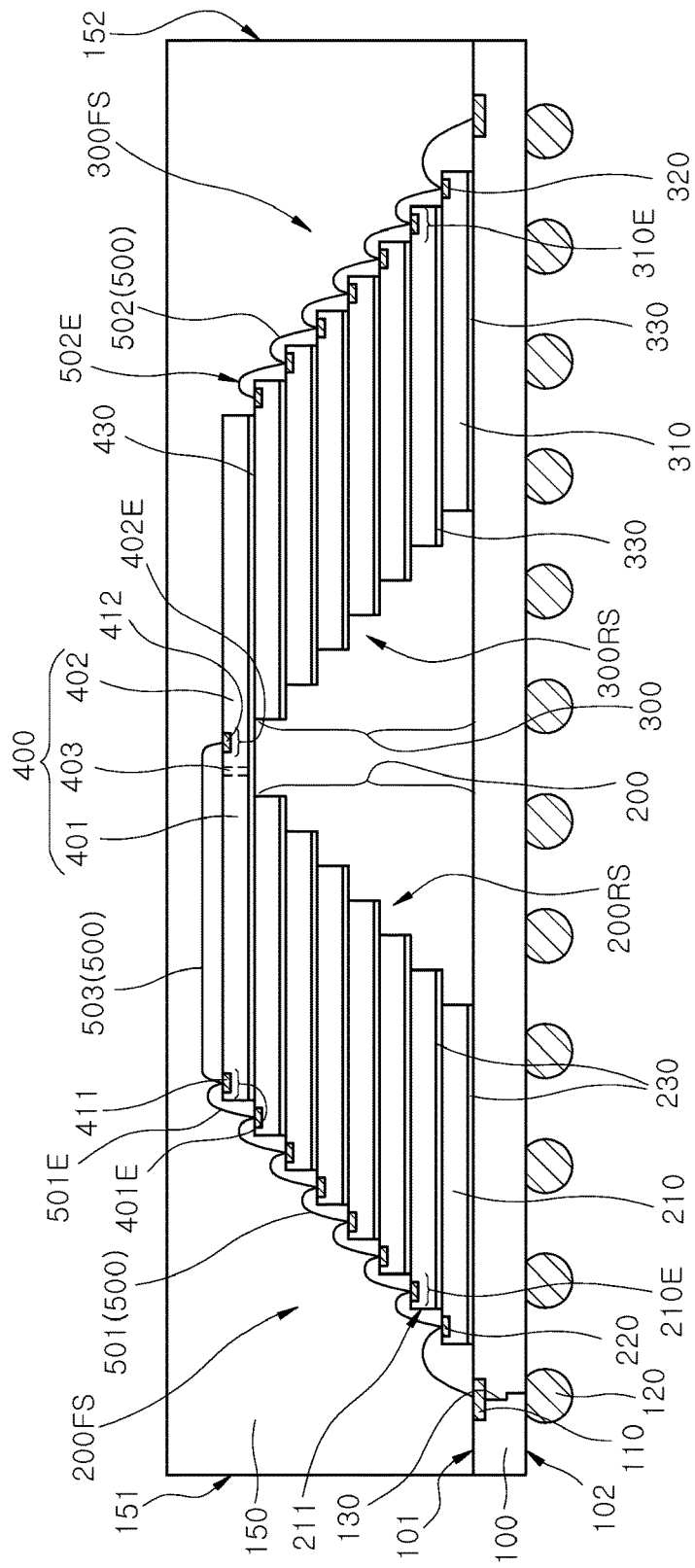
FIG. 2 is a cross-sectional view illustrating a semiconductor package according to an embodiment.

FIG. 2 is a cross-sectional view illustrating a semiconductor package 20 according to an embodiment. Referring to FIG. 2, the semiconductor package 20 may include the package substrate 100 and the first and second chip stacks 200 and 300 disposed on the package substrate 100. The first chip stack 200 may include the first chips 210 which are vertically stacked on the package substrate 100 to be offset in the first offset direction (207 of FIG. 1), and the second chip stack 300 may include the second chips 310 which are vertically stacked on the package substrate 100 to be offset in the second offset direction (307 of FIG. 1). The semiconductor package 20 may further include a third chip 400 which is supported by the first and second chip stacks 200 and 300. Both ends of the third chip 400 may be respectively put on the first and second chip stacks 200 and 300 like a bridge.

First chip connection patterns 220 may be disposed on the first edge portions 210E of the first chips 210, which are exposed at the first forward stepwise sidewall 200FS of the first chip stack 200. The first chip connection patterns 220 may be conductive connection pads of the first chips 210. The first chip connection patterns 220 may be disposed on positions of the first chips 210 which are offset along the first forward stepwise sidewall 200FS. The first chip connection patterns 220 may be provided to electrically connect the first chips 210 to each other or to electrically connect the first chips 210 to the package substrate 100.

Figure 3:
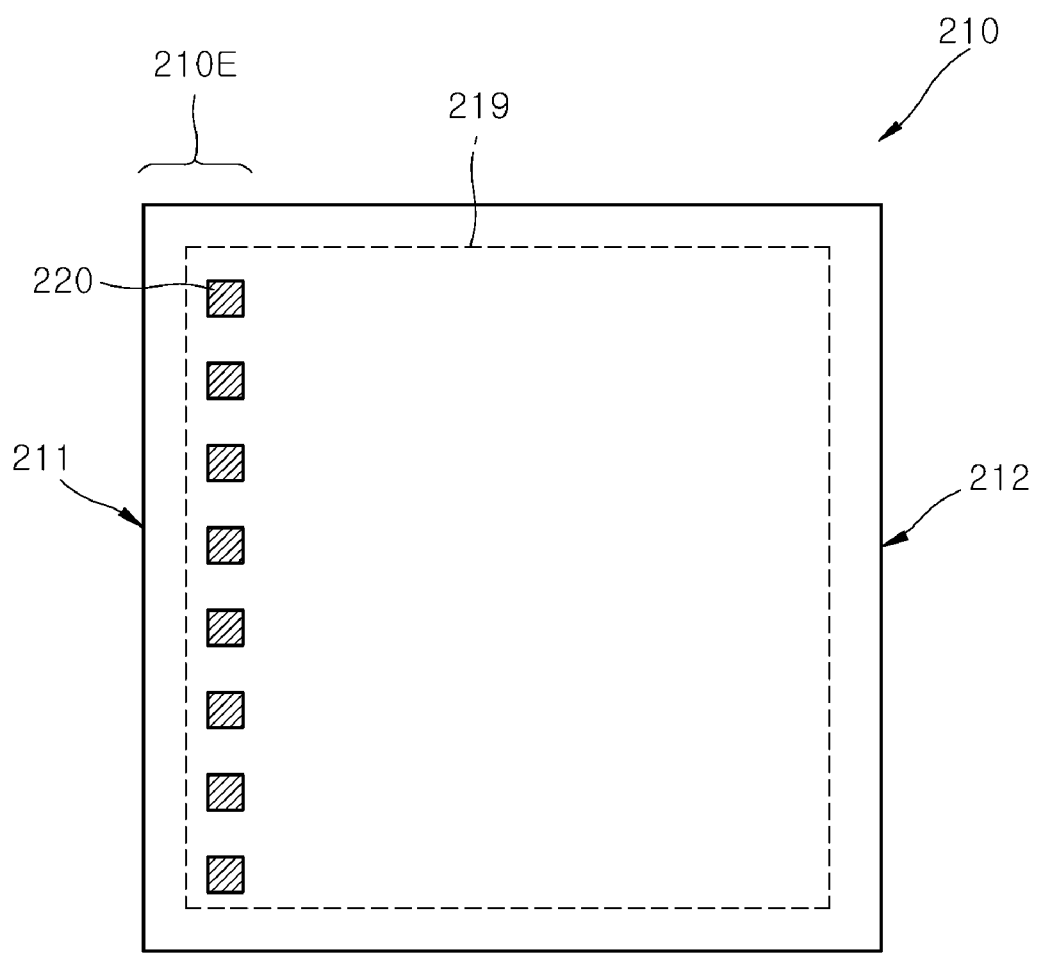
FIG. 3 is a plan view illustrating a first chip included in the semiconductor package of FIG. 2.

FIG. 3 is a plan view illustrating any one of the first chips 210 included in the semiconductor package 20 of FIG. 2. Referring to FIGS. 2 and 3, each of the first chips 210 may have a first sidewall 211 corresponding to a portion of the first forward stepwise sidewall 200FS of the first chip stack 200, and a second sidewall 212 corresponding to a portion of the first reverse stepwise sidewall 200RS of the first chip stack 200. Some of the first chip connection patterns 220 may be locally disposed only on the first edge portion 210E of the first chip 210, which is adjacent to the first sidewall 211 of the first chip 210. The first chip connection patterns 220 disposed on the first edge portion 210E of the first chip 210 may be arrayed in a column along the first sidewall 211. The first chip connection patterns 220 may be provided to transmit electrical signals to a first semiconductor device 219 integrated in the first chip 210 or to output electrical signals generated in the first semiconductor device 219. The first chip connection patterns 220 may not be disposed on an edge portion which is adjacent to a second sidewall 212 that is opposite to the first sidewall 211.

Referring again to FIG. 2, first bonding wires 501 may be coupled to the first chip connection patterns 220 exposed at the first forward stepwise sidewall 200FS to electrically connect the first chips 210 to each other or to electrically connect the first chips 210 to the package substrate 100. The first bonding wires 501 may correspond to a first portion of a chip connection structure 500 that electrically connects the first chips 210 to the package substrate 100. The first bonding wires 501 may be replaced with other conductive lines, for example, redistributed conductive lines.

The first bonding wires 501 may extend to be electrically connected to the package substrate 100. The package substrate 100 may have the first surface 101 on which the first and second chip stacks 200 and 300 are disposed and the second surface 102 which is opposite to the first and second chip stacks 200 and 300. The package substrate 100 may include a substrate body which is comprised of an insulation material or a dielectric material and trace patterns which are disposed on the first and second surfaces 101 and 102. Substrate connection patterns 110 corresponding to a portion of the trace patterns may be disposed on the first surface 101 of the package substrate 100. The first bonding wires 501 may be coupled to the substrate connection patterns 110. The outer connectors 120 may be disposed on the second surface 102 of the package substrate 100, and internal conductive patterns 130 may be disposed to substantially penetrate the substrate body of the package substrate 100. The first bonding wires 501 may be electrically coupled to the outer connectors 120 through the internal conductive patterns 130.

Second chip connection patterns 320 may be disposed on the second edge portions 310E of the second chips 310, which are exposed at the second forward stepwise sidewall 300FS of the second chip stack 300. The second chip connection patterns 320 may be locally disposed only on the second edge portions 310E of the second chips 310, which are adjacent to the second forward stepwise sidewall 300FS. The second chip connection patterns 320 may be disposed on positions of the second chips 310 which are offset along the second forward stepwise sidewall 300FS. The second chip connection patterns 320 may be provided to electrically connect the second chips 310 to each other or to electrically connect the second chips 310 to the package substrate 100.

Figure 4:
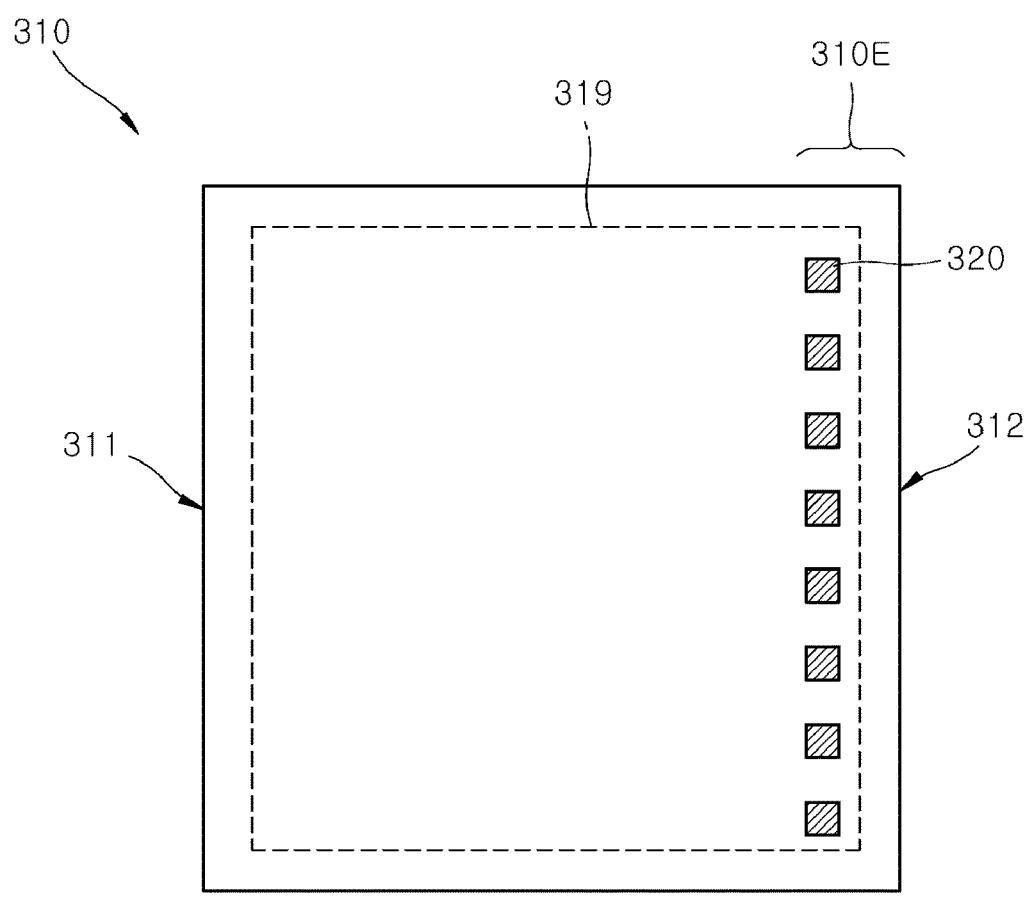
FIG. 4 is a plan view illustrating a second chip included in the semiconductor package of FIG. 2.

FIG. 4 is a plan view illustrating any one of the second chips 310 included in the semiconductor package 20 of FIG. 2. Referring to FIGS. 2 and 4, each of the second chips 310 may have a first sidewall 311 corresponding to a portion of the second reverse stepwise sidewall 300RS of the second chip stack 300 and a second sidewall 312 corresponding to a portion of the second forward stepwise sidewall 300FS of the second chip stack 300. Some of the second chip connection patterns 320 may be locally disposed only on the second edge portion 310E of the second chip 310, which is adjacent to the second sidewall 312 of the second chip 310. The second chip connection patterns 320 disposed on the second edge portion 310E of the second chip 310 may be arrayed in a column along the second sidewall 312. The second chip connection patterns 320 may be provided to transmit electrical signals to a second semiconductor device 319 integrated in the second chip 310 or to output electrical signals generated in the second semiconductor device 319. The second chip connection patterns 320 may not be disposed on an edge portion which is adjacent to the first sidewall 311 that is opposite to the second sidewall 312. The second sidewall 312 of the second chip 310 may be located at an opposite side of the first chip 210. The first sidewall 311 of the second chip 310 may face the second sidewall 212 of the first chip 210.

Referring again to FIG. 2, second bonding wires 502 may be coupled to the second chip connection patterns 320 exposed at the second forward stepwise sidewall 300FS to electrically connect the second chips 310 to each other or to electrically connect the second chips 310 to the package substrate 100. The second bonding wires 502 may correspond to a second portion of the chip connection structure 500 that electrically connects the second chips 310 to the package substrate 100. The second bonding wires 502 may extend to be electrically connected to the package substrate 100.

Figure 5:
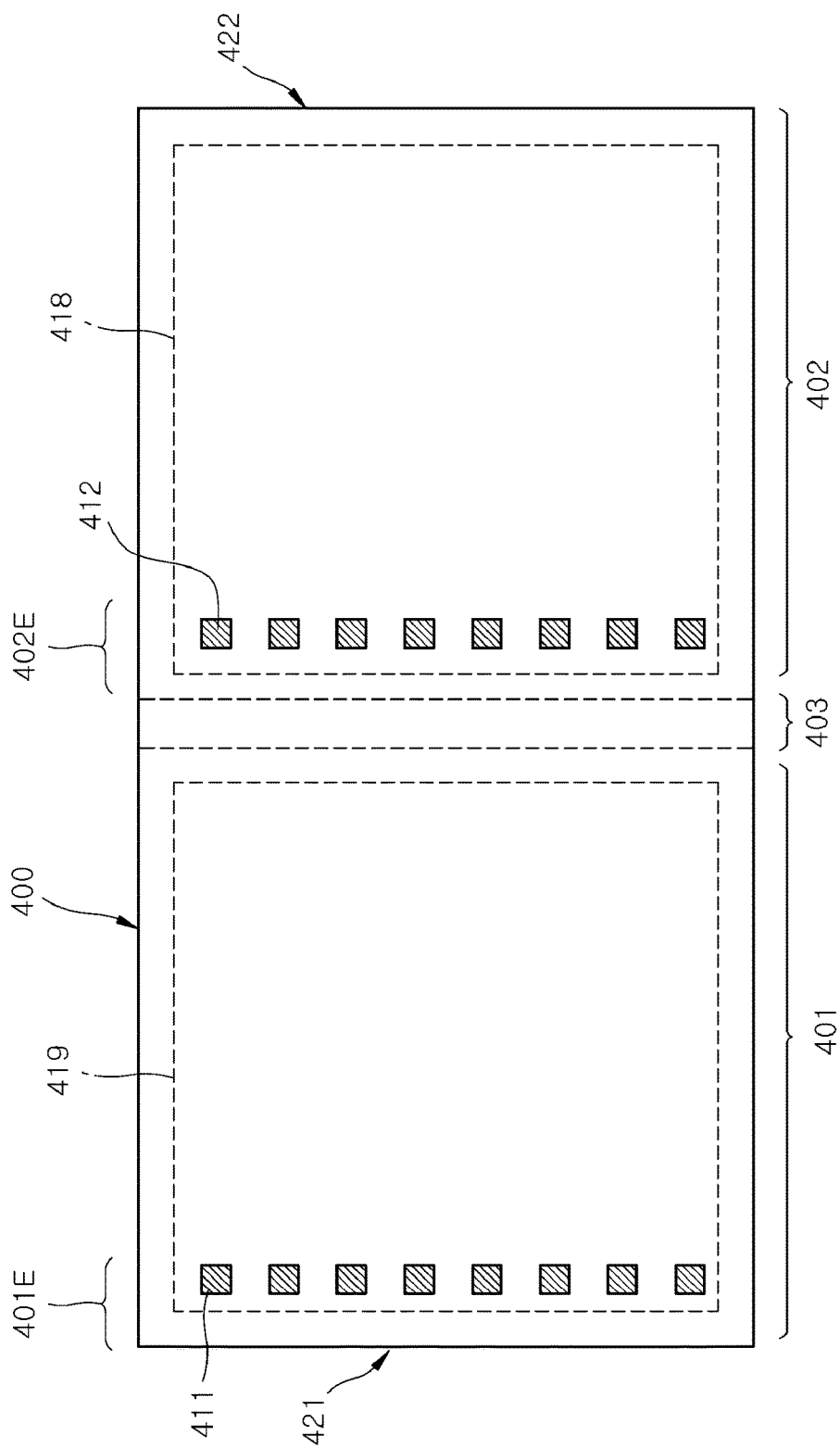
FIG. 5 is a plan view illustrating a third chip included in the semiconductor package of FIG. 2.

FIG. 5 is a plan view illustrating the third chip 400 included in the semiconductor package 20 of FIG. 2. Referring to FIGS. 2 and 5, the third chip 400 may correspond to a semiconductor chip which is located at a topmost level and which is supported by the first and second chip stacks 200 and 300. The third chip 400 may have a width which is greater than a width of the first chip stack 200 or the second chip stack 300 that is located thereunder. The third chip 400 may include a first sub-chip region 401, a second sub-chip region 402, and an intermediate link region 403 that is disposed between the first and second sub-chip regions 401 and 402 to combine the first sub-chip region 401 with the second sub-chip region 402. The first sub-chip region 401 may be a region in which a third semiconductor device 419 is integrated, and the second sub-chip region 402 may be a region in which a fourth semiconductor device 418 is integrated.

The third chip 400 may be a double die chip including two semiconductor chips. If the third chip 400 is cut along the intermediate link region 403, the first and second sub-chip regions 401 and 402 may be separated from each other to provide two separate semiconductor chips. The third chip 400 may correspond to a single chip in which the couple of first chips 210 are integrated. That is, in the event that the plurality of first chips 210 are integrated and formed in a single wafer, the third chip 400 may be obtained by cutting the wafer so that two adjacent first chips 210 are not separated from each other. In such a case, the intermediate link region 403 between the first and second sub-chip regions 401 and 402 may correspond to a scribe lane of the wafer.

In some other embodiments, the third chip 400 may be provided to include the coupled of second chips 310. In some other embodiments, the third chip 400 may be provided to include one of the first chips 210 and one of the second chips 310. Alternatively, the third chip 400 may be provided to include three or more sub-chip regions which are combined with each other. In such a case, each of the sub-chip regions may include any one of the first chip 210 and the second chip 310.

The third semiconductor device 419 and the fourth semiconductor device 418 may have the same shape and the same function. The third semiconductor device 419 and the fourth semiconductor device 418 may have the same shape and the same function as the first semiconductor device 219 of each of the first chips 210. The third semiconductor device 419 and the fourth semiconductor device 418 may have the same shape and the same function as the second semiconductor device 319 of each of the second chips 310. If the semiconductor package 20 is provided to have a large capacity of memory, the first to fourth memory devices 219, 319, 419, and 418 may be memory devices, for example, NAND-type memory devices having the same shape and the same function.

The first sub-chip region 401 of the third chip 400 may include first sub-chip connection patterns 411 for electrically connecting the third semiconductor device 419 to other devices. The first sub-chip connection patterns 411 may be conductive chip pads. The first sub-chip connection patterns 411 may be disposed on a third edge portion 401E of the first sub-chip region 401 along a first sidewall 421 of the first sub-chip region 401, like the first chip connection patterns 220 of the first chip 210. The first sidewall 421 of the first sub-chip region 401 may correspond to a first sidewall of the third chip 400, which is adjacent to the first forward stepwise sidewall (200FS of FIG. 2).

The second sub-chip region 402 of the third chip 400 may include second sub-chip connection patterns 412 for electrically connecting the fourth semiconductor device 418 to other devices. The second sub-chip connection patterns 412 may be disposed on a fourth edge portion 402E which is adjacent to the intermediate link region 403. The fourth edge portion 402E of the second sub-chip region 402 may be located at an opposite side of a second sidewall 422 of the second sub-chip region 402. The second sidewall 422 of the second sub-chip region 402 may correspond to a second sidewall of the third chip 400, which is adjacent to the second forward stepwise sidewall (300FS of FIG. 2). The first sidewall 421 of the first sub-chip region 401 may be located at an opposite side of the second sub-chip region 402, and the second sidewall 422 of the second sub-chip region 402 may be located at an opposite side of the first sub-chip region 401.

The first and second sub-chip regions 401 and 402 of the third chip 400 may have substantially the same shape and the same configuration. Thus, the first sub-chip connection patterns 411 may be arrayed to have substantially the same feature as an array of the second sub-chip connection patterns 412. The first sub-chip connection patterns 411 may be disposed to correspond to the second sub-chip connection patterns 412, respectively. That is, there may be a one-to-one relationship between the first sub-chip connection patterns 411 and the second sub-chip connection patterns 412.

Figure 6:
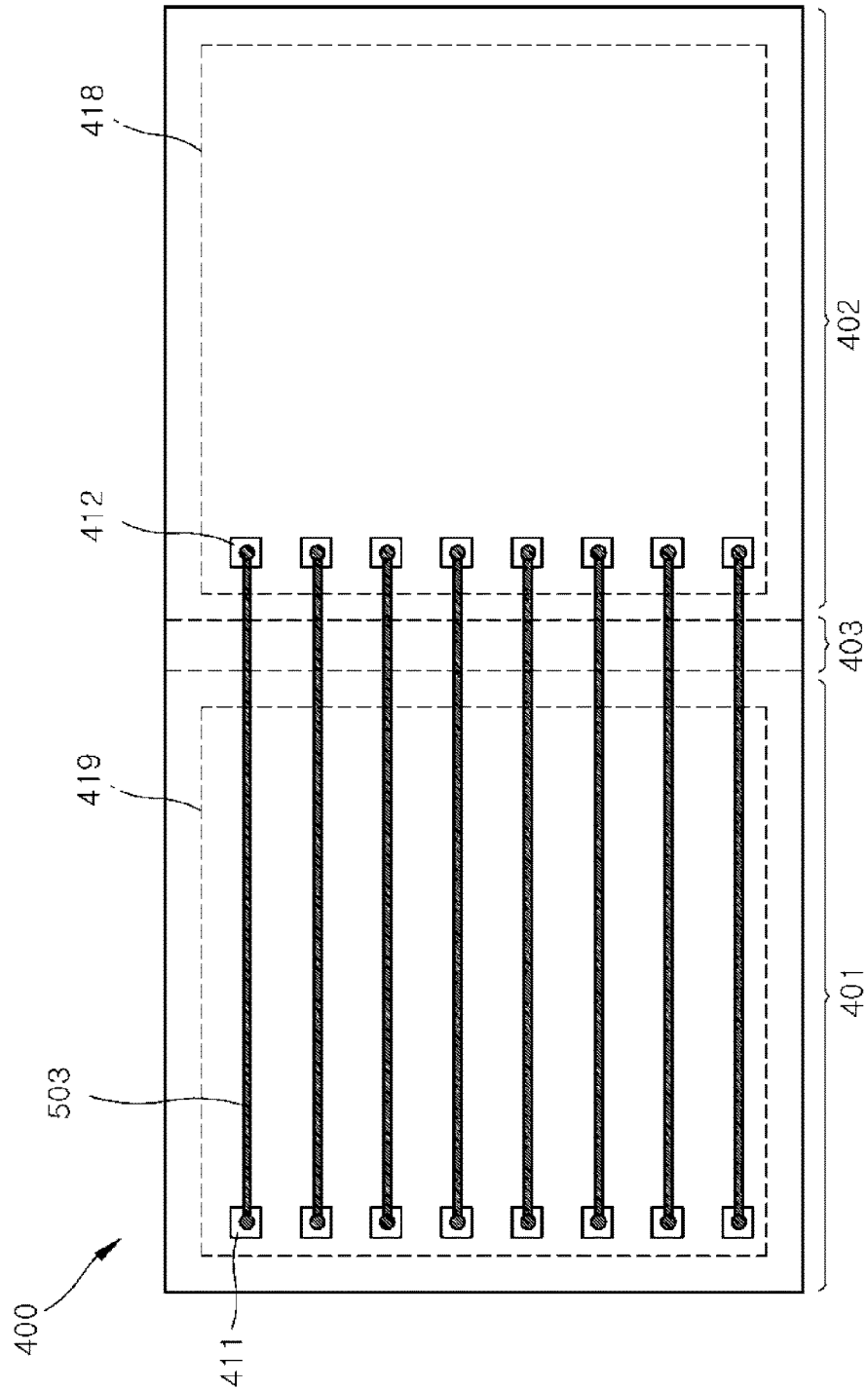
FIG. 6 is a plan view illustrating bonding wires connected to the third chip illustrated in FIG. 5.

FIG. 6 is a plan view illustrating third bonding wires 503 connected to the third chip 400 illustrated in FIG. 5. Referring to FIG. 6, the third bonding wires 503 may electrically connect the first sub-chip connection patterns 411 to the second sub-chip connection patterns 412. The third bonding wires 503 may correspond to a third portion of the chip connection structure (500 of FIG. 2). First ends of the third bonding wires 503 may be connected to the first sub-chip connection patterns 411, respectively. Second ends of the third bonding wires 503 may be connected to the second sub-chip connection patterns 412, respectively. Accordingly, each of the third bonding wires 503 may connect one of the first sub-chip connection patterns 411 to one of the second sub-chip connection patterns 412.

Referring to FIGS. 2 and 6, the first bonding wires 501 may extend to electrically connect the first chip stack 200 to the third chip 400. Extension portions 501E of the first bonding wires 501 may electrically connect the third chip 400 to the topmost chip (210T of FIG. 1) of the first chip stack 200. The extension portions 501E of the first bonding wires 501 may electrically connect the first sub-chip connection patterns 411 of the third chip 400 to the first chip connection patterns 220 of the topmost chip (210T of FIG. 1) of the first chip stack 200. Since the first bonding wires 501 are connected to the first sub-chip connection patterns 411 of the third chip 400, the third semiconductor device 419 integrated in the first sub-chip region 401 may be electrically connected to the package substrate 100 through the first bonding wires 501. Since the third bonding wires 503 electrically connect the first sub-chip connection patterns 411 to the second sub-chip connection patterns 412, the fourth semiconductor device 418 integrated in the second sub-chip region 402 may be electrically connected to the package substrate 100 through the third binding wires 503 and the first bonding wires 501. The second bonding wires 502 connected to the topmost chip 310T of the second chip stack 300 may not extend onto the third chip 400. Thus, the second chip stack 300 may not be directly connected to the third chip 400 or the third binding wires 503. In an embodiment, for example, extension portions 502E of the second bonding wires 502 may electrically connect the top most chip 310T (see FIG. 1) of the second chip stack 300 to a second chip connection pattern 320 of a second chip 310 in the second chip stack 300.

Although the present embodiment describes a case that the semiconductor package includes the third bonding wires 503 for connecting the first sub-chip connection patterns 411 of the third chip 400 to the second sub-chip connection patterns 412 of the third chip 400, the third bonding wires 503 may be replaced with other interconnection members according to the embodiments.

Referring again to FIG. 2, the semiconductor package 20 may further include an encapsulant 150 that is disposed on the first surface 101 of the package substrate 100 to cover the first and second chip stacks 200 and 300 and the third chip 400. The encapsulant 150 may be provided to protect the first and second chips 210 and 310 constituting the first and second chip stacks 200 and 300 as well as the third chip 400 from an external environment. The encapsulant 150 may include an insulation material or a dielectric material. For example, the encapsulant 150 may be formed of a molding layer including an epoxy molding compound (EMC) material.

The first chip stack 200 may be disposed so that the first forward stepwise sidewall 200FS of the first chip stack 200 is positioned to be adjacent to a first sidewall 151 of the encapsulant 150. The second chip stack 300 may be disposed so that the second forward stepwise sidewall 300FS of the second chip stack 300 is positioned to be adjacent to a second sidewall 152 of the encapsulant 150. The first sidewall 151 of the encapsulant 150 may be opposite to the second sidewall 152 of the encapsulant 150.

Figure 7:
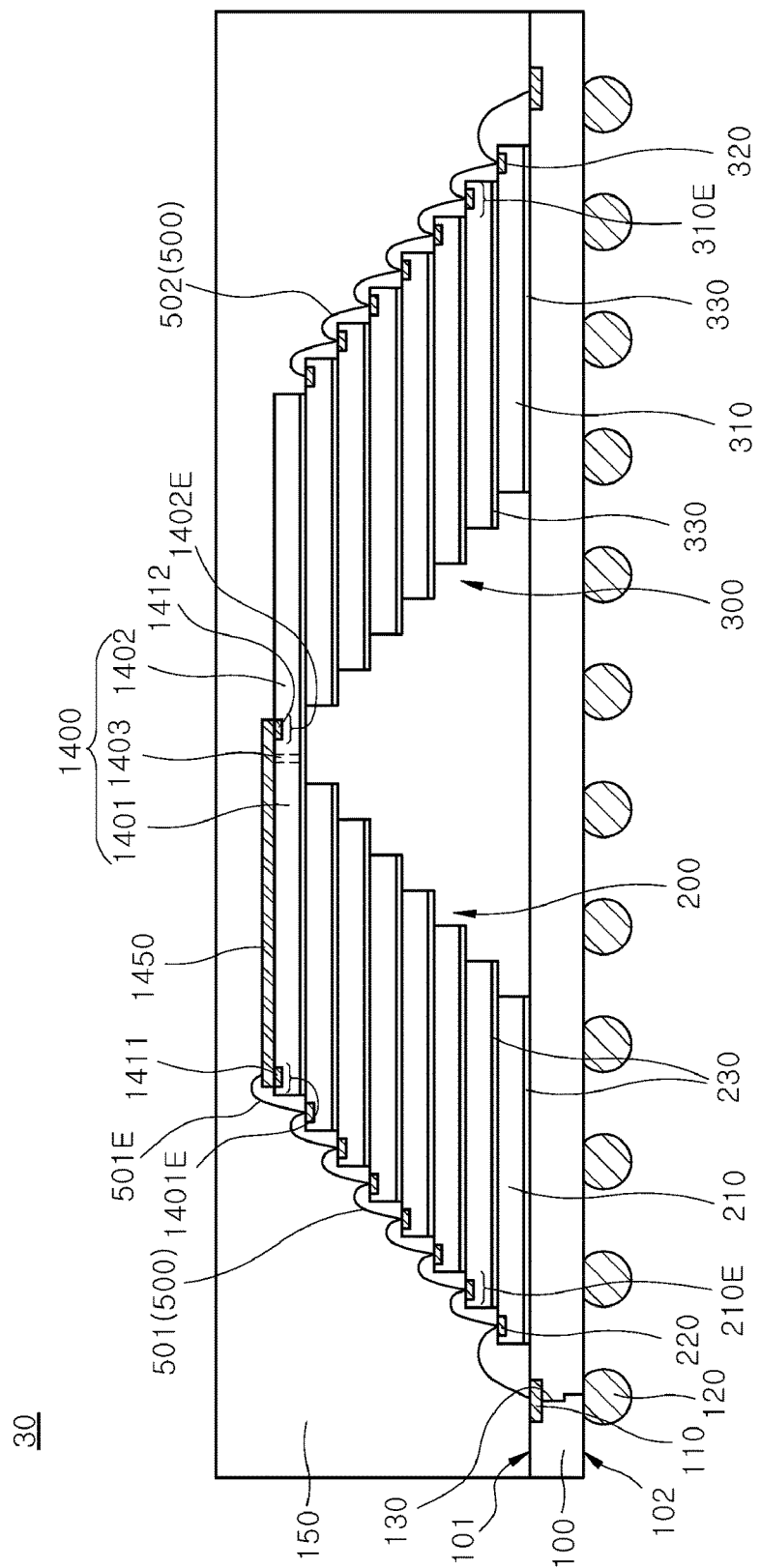
FIG. 7 is a cross-sectional view illustrating a semiconductor package according to an embodiment.
Figure 8:
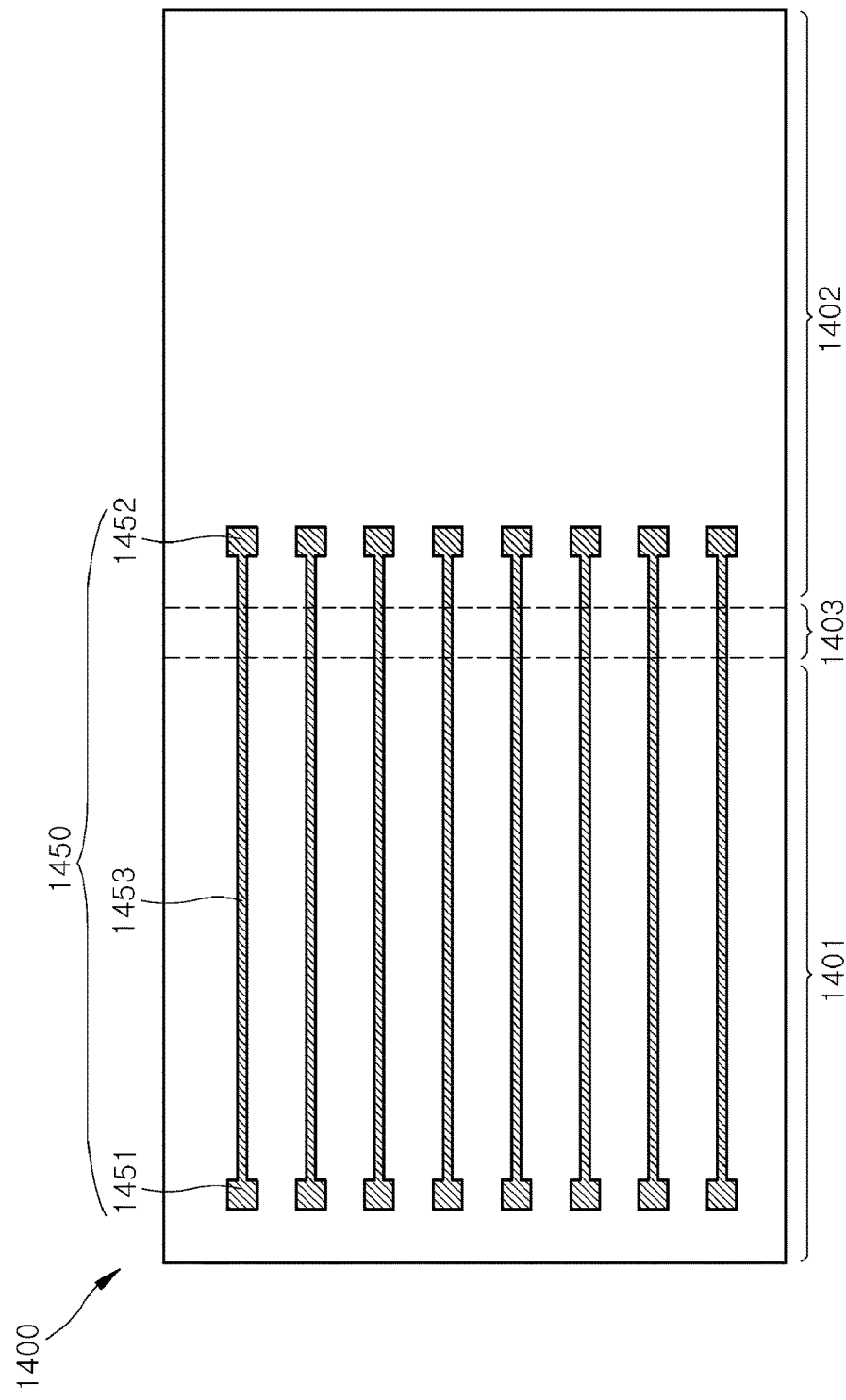
FIG. 8 is a plan view illustrating redistributed lines applied to a third chip of the semiconductor package illustrated in FIG. 7.

FIG. 7 is a cross-sectional view illustrating a semiconductor package 30 according to an embodiment, and FIG. 8 is a plan view illustrating redistributed lines 1450 disposed on a third chip 1400 of the semiconductor package 30 illustrated in FIG. 7. In addition, FIG. 9 is a cross-sectional view illustrating one of the redistributed lines 1450 illustrated in FIG. 8.

Referring to FIG. 7, the semiconductor package 30 may include the package substrate 100, the first and second chip stacks 200 and 300 disposed on the package substrate 100, and the chip connection structure 500 including the first and second bonding wires 501 and 502. The first bonding wires 501 may electrically connect the first chip stack 200 and the third chip 1400 to the package substrate 100, and the second bonding wires 502 may electrically connect the second chip stack 300 to the package substrate 100. The redistributed lines 1450 may be disposed on the third chip 1400 and may be electrically connected to the extension portions 501E of the first bonding wires 501. The redistributed lines 1450 may be a fourth portion of the chip connection structure 500. The first sub-chip connection patterns 1411 may be disposed on a third edge portion 1401E of the first sub-chip region 1401 along a first sidewall (421 of FIG. 5) of the first sub-chip region 1401 (401 of FIG. 5), like the first chip connection patterns 220 of the first chip 210. The second sub-chip connection patterns 1412 may be disposed on a fourth edge portion 1402E which is adjacent to the intermediate link region 1403. The fourth edge portion 1402E of the second sub-chip region 1402 may be located at an opposite side of a second sidewall (422 of FIG. 5) of the second sub-chip region 1402.

Figure 9:
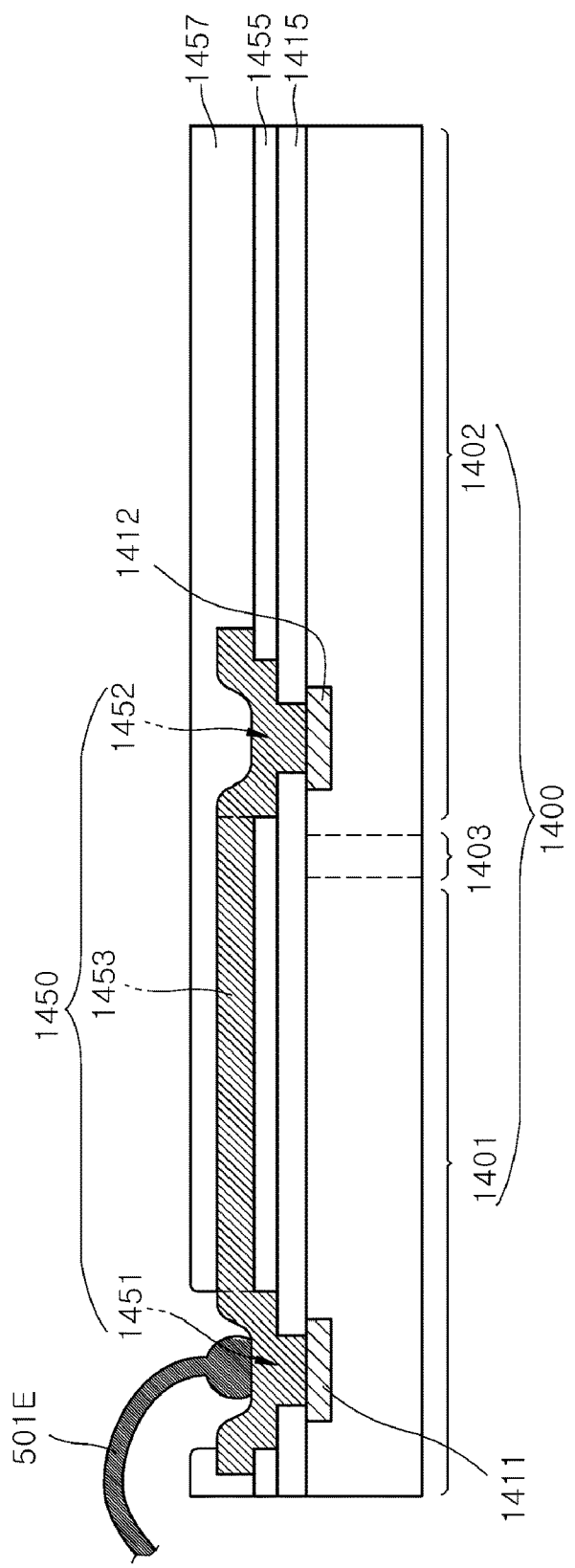
FIG. 9 is a cross-sectional view illustrating one of the redistributed lines illustrated in FIG. 8.

Referring to FIGS. 8 and 9, the redistributed lines 1450 may electrically connect a first sub-chip region 1401 of the third chip 1400 to a second sub-chip region 1402 of the third chip 1400. The third chip 1400 may further include an intermediate link region 1403 that is disposed between the first and second sub-chip regions 1401 and 1402 to combine the first sub-chip region 1401 with the second sub-chip region 1402. First connection portions 1451 corresponding to first ends of the redistributed lines 1450 may be connected to first sub-chip connection patterns 1411 of the first sub-chip region 1401, and second connection portions 1452 corresponding to second ends of the redistributed lines 1450 may be connected to second sub-chip connection patterns 1412 of the second sub-chip region 1402. The first sub-chip connection patterns 1411 of the first sub-chip region 1401 may be patterns corresponding to the first sub-chip connection patterns 411 of the first sub-chip region 401 illustrated in FIG. 5, and the second sub-chip connection patterns 1412 of the second sub-chip region 1402 may be patterns corresponding to the second sub-chip connection patterns 412 of the second sub-chip region 402 illustrated in FIG. 5. Each of the redistributed lines 1450 may further include an extension portion 1453 that extends from the first connection portion 1451 to reach the second connection portion 1452. The redistributed lines 1450 may be formed of conductive lines. Each of the redistributed lines 1450 may electrically connect one of the first sub-chip connection patterns 1411 to one of the second sub-chip connection patterns 1412.

Referring to FIG. 9, each of the redistributed lines 1450 may be a conductive pattern which is disposed on the third chip 1400. The third chip 1400 may include a passivation layer 1415 that exposes the first and second sub-chip connection patterns 1411 and 1412. The passivation layer 1415 may include a Polyimide-IsoindoloQuinazolinedione (PIQ) material. A first dielectric layer 1455 may be formed on the passivation layer 1415 to expose the first and second sub-chip connection patterns 1411 and 1412. A conductive layer may be formed on the first dielectric layer 1455, and the conductive layer may be patterned to form the redistributed lines 1450. The conductive layer for forming the redistributed lines 1450 may be a copper layer which is produced by a plating technique.

The conductive layer for forming the redistributed lines 1450 may be patterned such that each of the redistributed lines 1450 includes the first connection portion 1451 covering one of the first sub-chip connection patterns 1411, one of the second sub-chip connection patterns 1412, and the extension portion 1453 connecting the first connection portion 1451 to the second sub-chip connection patterns 1412. A second dielectric layer 1457 may be formed on the first dielectric layer 1455 to cover the redistributed lines 1450. The second dielectric layer 1457 may be patterned to expose the first connection portions 1451. In such a case, the second connection portion 1452 of the redistributed lines 1450 may be still covered with the second dielectric layer 1457. The extension portions 501E of the first bonding wires 501 may be connected to the first connection portions 1451 of the redistributed lines 1450, respectively. Thus, the first sub-chip connection patterns 1411 on the first sub-chip region 1401 of the third chip 1400 may be electrically connected to the first bonding wires 501, respectively, and the second sub-chip connection patterns 1412 on the second sub-chip region 1402 of the third chip 1400 may be electrically connected to the first bonding wires 501 through the redistributed lines 1450, respectively.

If the redistributed lines 1450 instead of the third bonding wires 503 illustrated in FIG. 6 are employed in the semiconductor package 30, an electric short failure between the third bonding wires 503, which may be capable of occurring during a molding process for forming the encapsulant 150, may be resolved.

Figure 10:
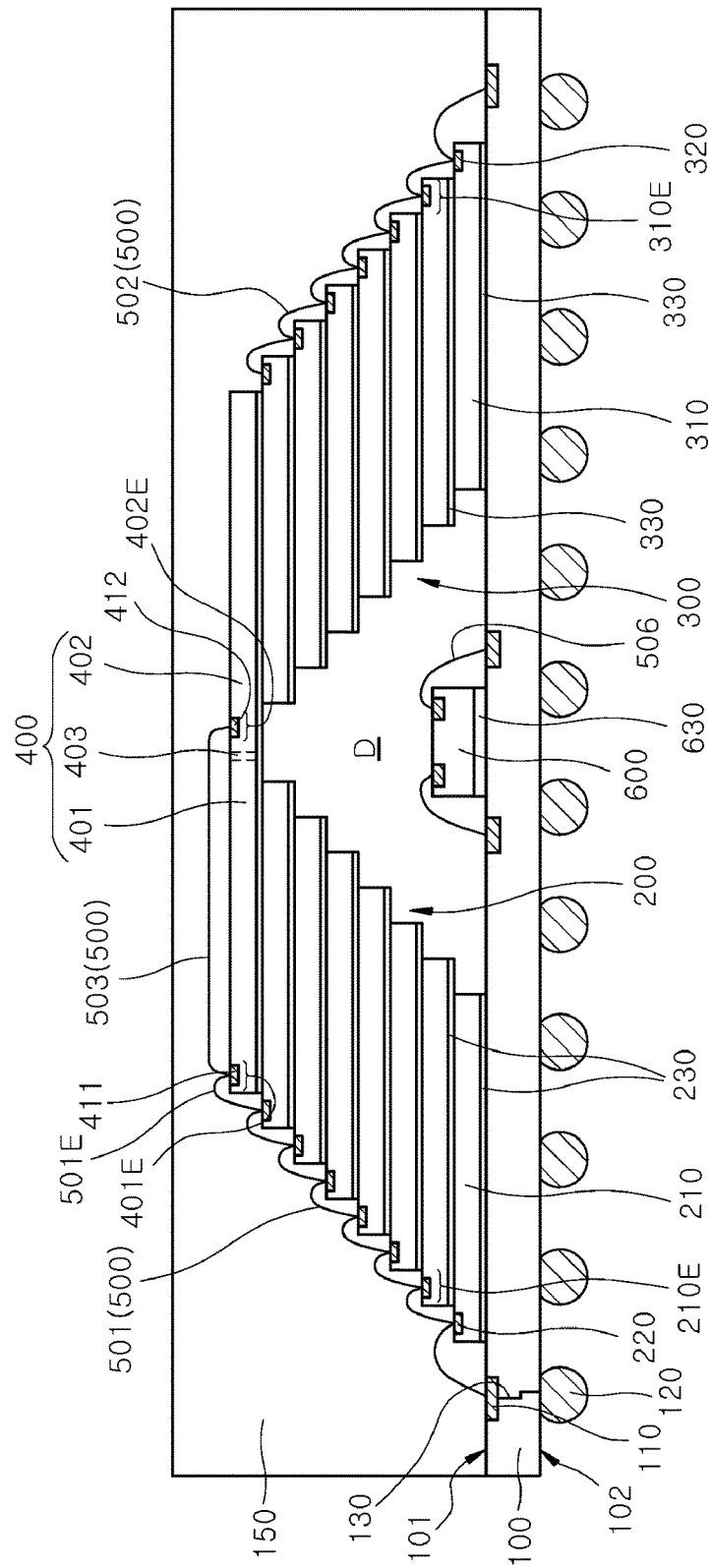
FIG. 10 is a cross-sectional view illustrating a semiconductor package according to an embodiment.

FIG. 10 is a cross-sectional view illustrating a semiconductor package 40 according to an embodiment.

Referring to FIG. 10, the semiconductor package 40 may include a fourth semiconductor chip 600 which is disposed on the package substrate 100 and in the space D between the first and second chip stacks 200 and 300. The fourth semiconductor chip 600 may be additionally employed in any one of the semiconductor packages 10, 20, and 30 illustrated in FIGS. 1, 2 and 7. The fourth semiconductor chip 600 may include a controller device that controls operations of the first chips 210 constituting the first chip stack 200, the second chips 310 constituting the second chip stack 300, and the third chip 400 or 1400. Since the fourth semiconductor chip 600 is disposed in the space D between the first and second chip stacks 200 and 300, the semiconductor package 40 may be realized even without increasing a width of the package substrate 100. That is, a space on the package substrate 100 may be efficiently used to provide the semiconductor package 40 corresponding to a compact package. A fourth adhesive layer 630 may be introduced into an interface between the fourth semiconductor chip 600 and the package substrate 100 to attach the fourth semiconductor chip 600 to the package substrate 100. The fourth semiconductor chip 600 may be electrically connected to the package substrate 100 through fourth bonding wires 506.

Figure 11:
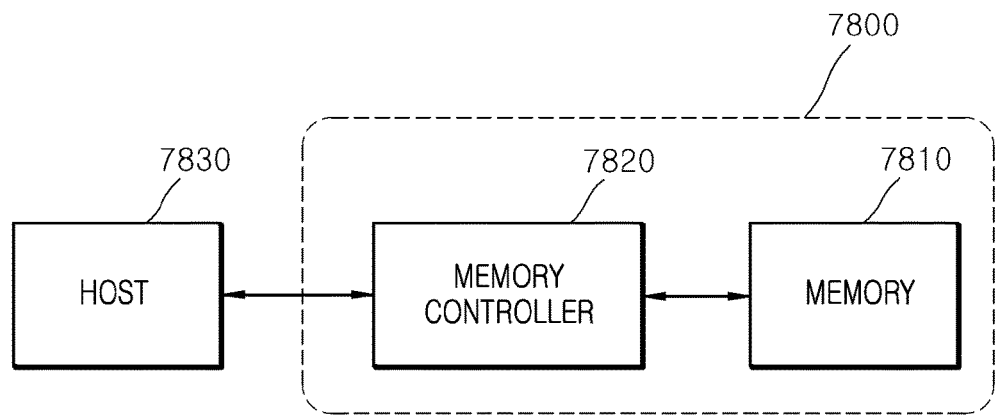
FIG. 11 is a block diagram illustrating an electronic system employing a memory card including at least one of semiconductor packages according to some embodiments.

FIG. 11 is a block diagram illustrating an electronic system including a memory card 7800 employing at least one of the semiconductor packages according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read and write (read/write) request from a host 7830.

Figure 12:
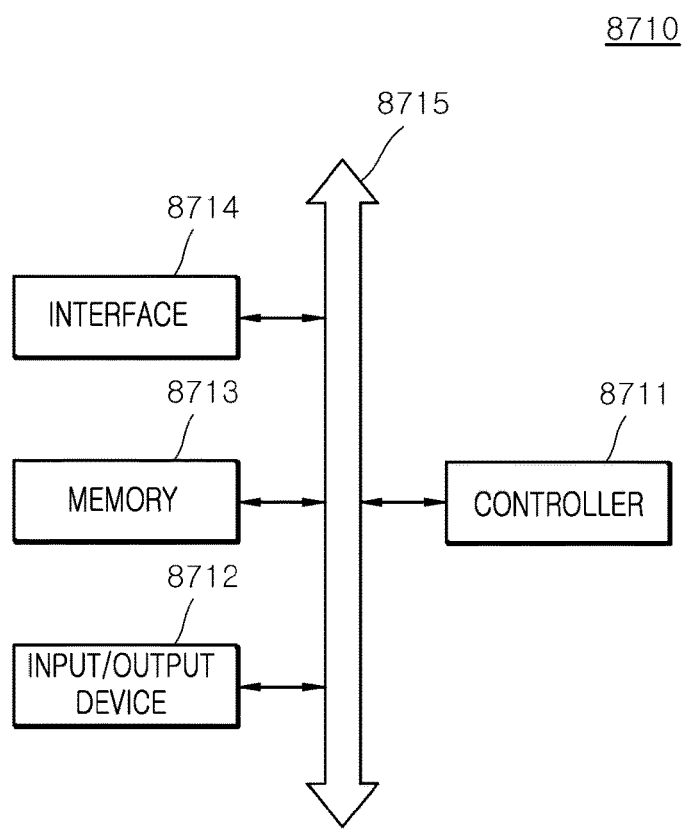
FIG. 12 is a block diagram illustrating an electronic system including at least one of semiconductor packages according to some embodiments.

FIG. 12 is a block diagram illustrating an electronic system 8710 including at least one of the packages according to the embodiments. The electronic system 8710 may include a controller 8711, an input and output (input/output) device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission and reception (transmission/reception) system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a first chip stack including first chips which are offset from one another and stacked on a package substrate;
   a second chip stack including second chips which are offset from one another and stacked on the package substrate;
   a third chip supported by the first and second chip stacks;
   first bonding wires electrically connecting the first chips to the package substrate; and
   second bonding wires electrically connecting the second chips to the package substrate,
   wherein the first bonding wires extend to provide extension portions connecting the first chip stack to the third chip,
   wherein the third chip is directly electrically connected only to the first chip stack.

2. The semiconductor package of claim 1, wherein the first chip stack and the second chip stack are disposed to be spaced apart from each other.

3. The semiconductor package of claim 1,
   wherein each of the first chips includes an edge portion on which first chip connection patterns connected to the first bonding wires are disposed; and
   wherein the first chips are offset to expose the first chip connection patterns.

4. The semiconductor package of claim 1, wherein a direction in which the first chips are offset is opposite to a direction in which the second chips are offset.

5. The semiconductor package of claim 1, wherein the first chip stack has substantially the same height as the second chip stack.

6. The semiconductor package of claim 1, wherein the first chips, the second chips, and the third chip have the same function.

7. The semiconductor package of claim 1, further comprising a fourth chip disposed between the first and second chip stacks and on the package substrate.

8. The semiconductor package of claim 1, further comprising an encapsulant covering the first chip stack, the second chip stack, and the third chip,
   wherein the first chip stack is disposed such that a first forward stepwise sidewall of the first chip stack is adjacent to a first sidewall of the encapsulant, and the second chip stack is disposed such that a second forward stepwise sidewall of the second chip stack is adjacent to a second sidewall of the encapsulant opposite to the first sidewall.

9. A semiconductor package comprising:
- a first chip stack including a first reverse stepwise sidewall disposed on a package substrate;
- a second chip stack including a second reverse stepwise sidewall disposed on the package substrate; and
- a third chip disposed on the first and second chip stacks,
- wherein chips of the first and second chip stacks are configured and the first and second chips stacks are positioned on the package substrate so that the second reverse stepwise sidewall faces the first reverse stepwise sidewall,
- first bonding wires electrically connecting the first chips to the package substrate; and
- second bonding wires electrically connecting the second chips to the package substrate,
- wherein the first bonding wires extend to provide extension portions connecting the first chip stack to the third chip,
- wherein the third chip is directly electrically connected only to the first chip stack.

10. The semiconductor package of claim 9, wherein at least one chip from the chips of the first and second chip stacks is offset from another chip of the chips of the first and second chip stacks.

11. The semiconductor package of claim 9, wherein the third chip is disposed on the first and second chip stacks to prevent the first and second chip stacks from collapsing.

12. The semiconductor package of claim 9, further comprising:
- a space between the first and second chip stacks and under the third chip.

* * * * *